(12) United States Patent
Haley et al.

(10) Patent No.: US 11,681,340 B2
(45) Date of Patent: Jun. 20, 2023

(54) BLOW-THROUGH AXIAL FAN FOR A GRAPHICS PROCESSING UNIT

(71) Applicant: NVIDIA CORPORATION, Santa Clara, CA (US)

(72) Inventors: David Haley, Beaverton, OR (US); Xiang Sun, Los Gatos, CA (US); Gabriele Gorla, Santa Clara, CA (US); Andrew Bell, San Francisco, CA (US); Boris Landwehr, Thousand Oaks, CA (US)

(73) Assignee: NVIDIA CORPORATION, Santa Clara, CA (US)

( * ) Notice: Subject to any disclaimer, the term of this patent is extended or adjusted under 35 U.S.C. 154(b) by 0 days.

(21) Appl. No.: 17/121,565

(22) Filed: Dec. 14, 2020

(65) Prior Publication Data

US 2021/0294397 A1 Sep. 23, 2021

Related U.S. Application Data

(60) Provisional application No. 62/991,013, filed on Mar. 17, 2020.

(51) Int. Cl.
*G06F 1/20* (2006.01)
*H05K 7/20* (2006.01)

(52) U.S. Cl.
CPC ............. *G06F 1/20* (2013.01); *H05K 7/2039* (2013.01); *H05K 7/20154* (2013.01); *G06F 2200/201* (2013.01)

(58) Field of Classification Search
CPC ...... G06F 1/20; G06F 2200/201; G06F 1/206; H05K 7/20145; H05K 7/20754; H05K 7/20727; H05K 7/20172; H05K 7/20136; H05K 7/20154; H05K 7/2039; H05K 7/20572; H05K 7/2019; H05K 7/202; H05K 7/20609
See application file for complete search history.

(56) References Cited

U.S. PATENT DOCUMENTS

| | | | | |
|---|---|---|---|---|
| 6,208,510 B1* | 3/2001 | Trudeau | ............ | H05K 7/20609 165/80.3 |
| 6,538,881 B1* | 3/2003 | Jeakins | ............ | H05K 7/20572 165/122 |
| 2005/0276017 A1* | 12/2005 | Aziz | ............ | H04Q 1/023 361/695 |
| 2006/0232934 A1* | 10/2006 | Kusamoto | ............ | G06F 1/203 361/679.47 |

(Continued)

*Primary Examiner* — Adam B Dravininkas
(74) *Attorney, Agent, or Firm* — Artegis Law Group, LLP

(57) ABSTRACT

A graphics subsystem includes a printed circuit board (PCB), a set of one or more fans, and a heat sink. A graphics processing unit (GPU) is integrated into the PCB. The PCB is shortened to occupy a portion of the width of the graphics subsystem. The heat sink is coupled to the PCB and/or GPU and configured to extend beyond an edge of the PCB, thereby occupying a larger portion of the width of the graphics subsystem compared to the PCB. A first fan is disposed partially or fully beyond the edge of the PCB and is configured to direct air through the portion of the heat sink that extends beyond the edge of the PCB, along a first airflow path, and out of the graphics subsystem. A second fan is configured to direct air through the heat sink, along a second airflow path, towards the GPU.

20 Claims, 6 Drawing Sheets

(56) References Cited

U.S. PATENT DOCUMENTS

| | | | |
|---|---|---|---|
| 2007/0121289 A1* | 5/2007 | Peng | G06F 1/20 257/E23.099 |
| 2010/0238628 A1* | 9/2010 | Hung | G06F 1/183 361/688 |
| 2014/0098493 A1* | 4/2014 | Chen | H05K 7/20145 361/692 |
| 2015/0124405 A1* | 5/2015 | Lee | F04D 29/601 415/203 |
| 2017/0311487 A1* | 10/2017 | Rau | G06F 1/20 |
| 2019/0227605 A1* | 7/2019 | Wiltzius | G06F 1/186 |

* cited by examiner

BLOW-THROUGH AXIAL FAN FOR A GRAPHICS PROCESSING UNIT

CROSS-REFERENCE TO RELATED APPLICATIONS

This application claims the priority benefit of United States provisional patent application titled, "Blow-Through Axial Fan for a Graphics Processing Unit," filed on Mar. 17, 2020 and having Ser. No. 62/991,013. The subject matter of this related application is hereby incorporated herein by reference.

BACKGROUND

Field of the Various Embodiments

Conventional computer systems typically include at least one central processing unit (CPU) and at least one graphics processing unit (GPU). The CPU executes various types of software applications, while the GPU performs graphics processing operations on behalf of the CPU. Certain types of computer systems may include a GPU that is integrated onto a motherboard where the CPU resides; whereas, other types of computer systems may include a GPU that resides within a graphics subsystem that is coupled to the motherboard via a peripheral component interface express (PCIe) slot.

A conventional graphics subsystem usually includes a printed circuit board (PCB) where the GPU resides, at least one fan, and a heat sink. The GPU is normally integrated into the PCB and electronically coupled to various other electronic components. The heat sink is thermally coupled to the GPU and/or the PCB and includes a set of cooling fins. The fan is typically disposed proximate to the heat sink and configured to direct airflow towards the cooling fins.

During operation, the GPU generates heat that needs to be dissipated in order to prevent overheating. In that regard, the heat sink is configured to extract heat generated by the GPU and to dissipate that heat into the general environment via the cooling fins. The fan simultaneously circulates air across the cooling fins in order to provide a convective cooling effect that increases the rate of heat dissipation. In this manner, the heat sink and the fan interoperate to cool the GPU and keep the operating temperature of the GPU within a specified range.

As a general matter, GPUs that operate at higher frequencies generate more heat than GPUs that operate at lower frequencies. Accordingly, a GPU subsystem that includes a GPU operating at a higher frequency needs more effective cooling to prevent overheating. One approach to providing more effective cooling to GPUs is to implement a larger fan that increases the rate of air circulation across the heat fins of the heat sink. However, this approach has limited applicability because the PCIe slot where the graphics subsystem resides has a specific form factor that cannot physically accommodate fans that are larger than a particular size. Consequently, conventional graphics subsystems typically cannot be equipped with GPUs that operate at relatively higher frequencies.

As the foregoing illustrates, what is needed in the art are more effective approaches to cooling GPUs within graphics subsystems.

SUMMARY

Various embodiments include a system, including a printed circuit board on which a processor resides, a first fan that is coupled to the printed circuit board such that a first airflow path for cooling the processor traverses through the first fan at a distance outside of a boundary of the printed circuit board, and a second fan that is coupled to the printed circuit board such that a second airflow path for cooling the processor traverses through the second fan within the boundary of the printed circuit board.

At least one technological advantage of the disclosed techniques relative to the prior art is that graphics subsystems can be equipped with higher performance GPUs relative to the GPUs typically included in conventional graphics subsystems.

BRIEF DESCRIPTION OF THE DRAWINGS

So that the manner in which the above recited features of the various embodiments can be understood in detail, a more particular description of the inventive concepts, briefly summarized above, may be had by reference to various embodiments, some of which are illustrated in the appended drawings. It is to be noted, however, that the appended drawings illustrate only typical embodiments of the inventive concepts and are therefore not to be considered limiting of scope in any way, and that there are other equally effective embodiments.

DETAILED DESCRIPTION

In the following description, numerous specific details are set forth to provide a more thorough understanding of the various embodiments. However, it will be apparent to one skilled in the art that the inventive concepts may be practiced without one or more of these specific details.

As noted above, a GPU subsystem that includes a GPU operating at a high frequency needs more effective cooling to prevent overheating. A larger fan can provide more effective cooling by increasing the rate of air circulation across the heat fins. However, the PCIe slot where the graphics subsystem resides has a specific form factor that typically cannot physically accommodate a fan that is larger than a particular size. Consequently, conventional graphics subsystems usually can only be equipped with GPUs that operate at lower frequencies.

To address these issues, various embodiments include a graphics subsystem that includes a PCB, a set of fans, and a heat sink. A GPU is integrated into the PCB. The PCB is shortened to occupy a smaller portion of the width of the graphics subsystem compared to the PCB within a conventional graphics subsystem. The heat sink is coupled to the PCB and/or GPU and configured to extend beyond an edge of the PCB, thereby occupying a larger portion of the width of the graphics subsystem compared to the PCB. A first fan is disposed partially or fully beyond the edge of the PCB and is configured to direct air through the portion of the heat sink that extends beyond the edge of the PCB, along a first airflow path, and out of the graphics subsystem. A second fan is configured to direct air through the heat sink, along a second airflow path, towards the GPU. Because the first airflow path is not impeded by the PCB, air traversing the first airflow path has a low pressure and a high flow rate, thereby increasing the convective cooling capabilities of the heat sink. Further, some of the air traversing the second airflow path may mix with air traversing the first airflow path, thereby reducing the recirculation of warmer air induced by the second fan.

At least one technical advantage of the disclosed design relative to the prior art is that, with the disclosed design, graphics subsystems can be equipped with higher performance GPUs relative to the GPUs typically included in conventional graphics subsystems. Accordingly, the disclosed design enables higher performance GPUs to be implemented in computer systems without a substantial risk of overheating. These technical advantages represent one or more technological advancements over prior art approaches.

System Overview

Figure 1:
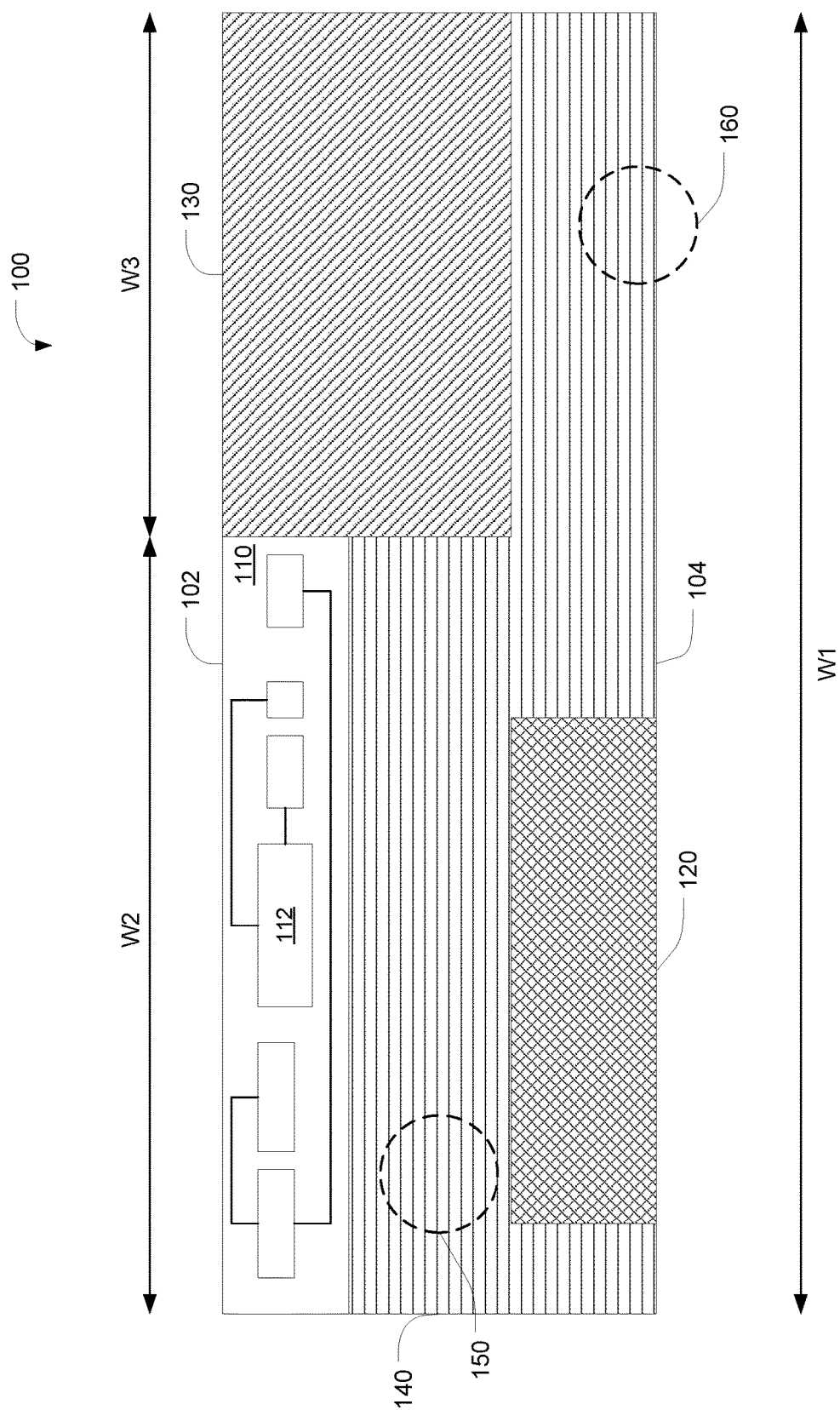
FIG. 1 illustrates a graphics subsystem configured to implement one or more aspects of the various embodiments.

FIG. 1 illustrates a graphics subsystem configured to implement one or more aspects of the various embodiments. As shown, graphics subsystem 100 includes a PCB 110, fans 120 and 130, heat sink 140, cooling fins 150, and heat pipes 160. PCB 110 is disposed proximate to a top side 102 of graphics subsystem 100 and includes a GPU 112 and various other electronic components. In one embodiment, PCB 110 may include any technically feasible type of processor in addition to, or instead of, GPU 112, such as one or more central processing units (CPUs), among other types of processors. In such embodiments, graphics subsystem 100 may be implemented as a generic add-in card. Fan 120 is disposed proximate to a bottom side 104 of graphics subsystem 100 and is embedded partially or completely within heat sink 140. In various embodiments, fan 130 may be disposed proximate to top side 102 of graphics subsystem 100 or at any other technically feasible location within graphics subsystem 100. Fan 130 is disposed proximate to top side 102 of graphics subsystem 100 and is embedded partially or fully within heat sink 140. In various embodiments, either or both of fans 120 and 130 need not be embedded within heat sink 140. In some embodiments, fan 120 may be omitted entirely. In one embodiment, fans 120 and/or 130 may be axial fans having axes that are substantially perpendicular to PCB 110. The term "substantially perpendicular" in this context indicates that the axes of the axial fans are disposed within a certain angular range of perpendicular relative to PCB 110. Heat sink 140 is thermally coupled to PCB 110 and/or GPU 112 and configured to extract heat from PCB 110 and/or GPU 112. Heat sink 140 may include any technically feasible type of heat dissipation and/or heat transport mechanism, including cooling fins 150, heat pipes 160, and so forth.

As also shown, graphics subsystem 100 has a width of approximately W1, PCB 110 has a width of approximately W2, and fan 130 has a width of approximately W3. PCB 110 occupies only a portion of the total width W1 of graphics subsystem 100 and graphics subsystem 100 can therefore accommodate the presence of fan 130 adjacent to PCB 110. In this configuration, fans 120 and 130 can cool PCB 110 and/or GPU 112 more effectively than possible with conventional designs, as described in greater detail below in conjunction with FIG. 2.

Figure 2:
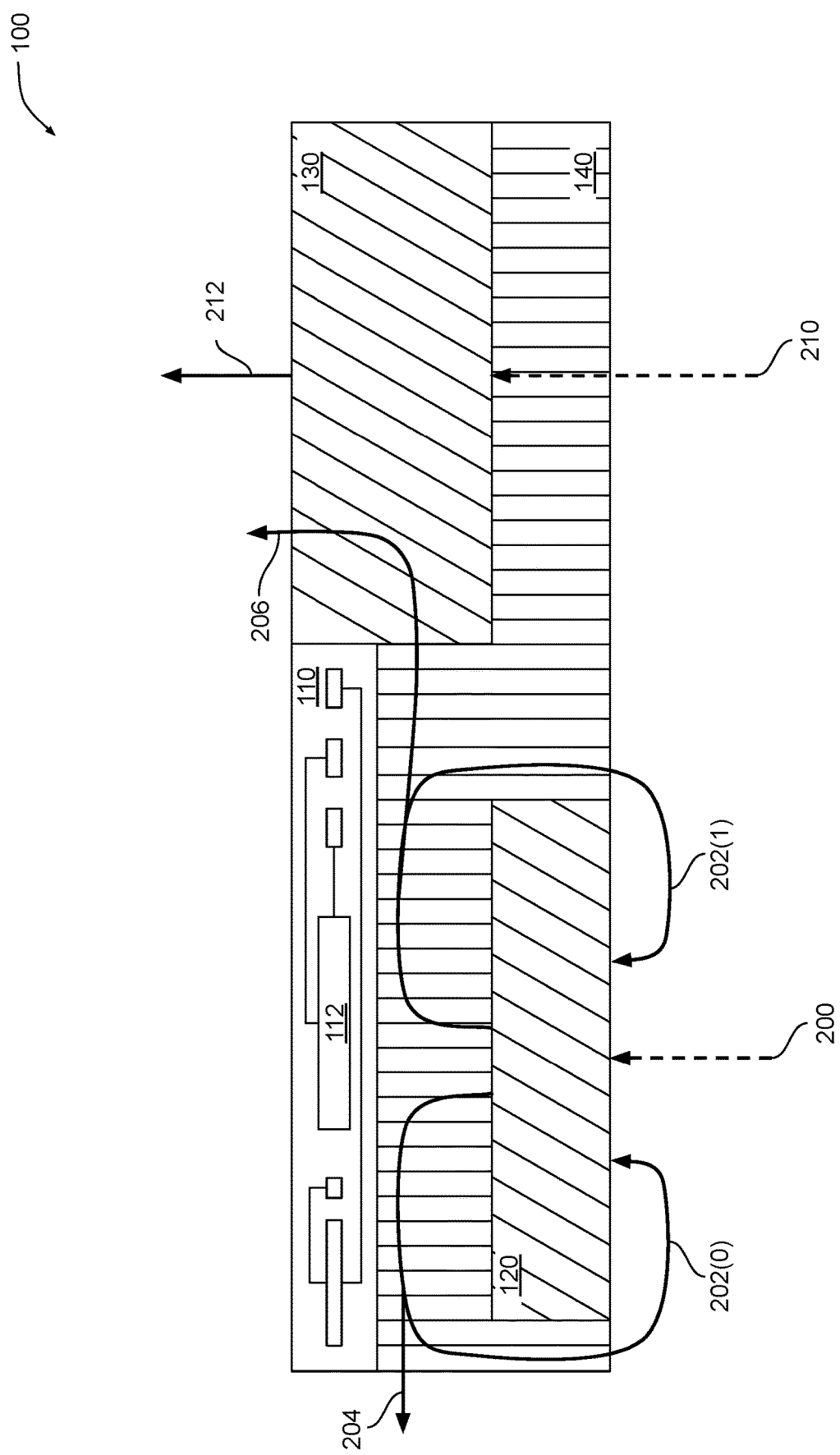
FIG. 2 illustrates how air circulates within the graphics subsystem of FIG. 1, according to various embodiments.

FIG. 2 illustrates how air circulates within the graphics subsystem of FIG. 1, according to various embodiments. As shown, during operation, fan 120 intakes air along airflow path 200 and directs the air through heat sink 140 towards PCB 110 and/or GPU 112. Heat sink 140 transfers heat that is extracted from PCB 110 and/or GPU 112 into the air via a heat transference mechanism, such as heat fins. Portions of the heated air recirculate along airflow paths 202(0) and 202(1), other portions of the heated air exit graphics subsystem 100 along airflow path 204, and yet other portions of the heated air are drawn into fan 130 along airflow path 206.

As also shown, during operation, fan 130 intakes air through heat sink 140 along airflow path 210. Heat sink 140 transfers heat that is extracted from PCB 110 and/or GPU 112 into the air. Fan 130 then directs the heated air out of graphics subsystem 100 along airflow path 212. At least a portion of airflow path 210 and/or airflow path 212 is substantially linear. As referred to herein, the term "substantially linear" may refer to any path that curves by less than a threshold amount of curvature. As noted above, fan 130 also intakes heated air along airflow path 206 and directs that air out of graphics subsystem 100 along airflow path 212. One advantage of the disclosed design is that fan 130 intakes fresh air across heat sink 140, and that fresh air may have a lower temperature compared to air that is exhausted from a fan across a heat sink, as found in conventional designs. Accordingly, the disclosed design can provide greater convective cooling than conventional designs. In one embodiment, fan 130 may be configured to exhaust air through heat sink 140. In various other embodiments, graphics subsystem 100 may include three or more fans, where any of those fans are configured to direct any portion of air through heat sink 140. For example, a third fan, in addition to fans 120 and 130, could be configured to direct air such that any portion of that air traverses heat sink 140.

Airflow paths 210 and 212 are relatively unimpeded by PCB 110 and heat sink 140. As a result, fan 130 can direct air along airflow paths 210 and 212 at a low pressure and with a high flow rate that achieves a greater transfer of heat from heat sink 140. Further, because fan 130 intakes heated air from fan 120 along airflow path 206, fan 130 can lower the temperature of heated air that recirculates along airflow pathways 202, which increases the rate of heat transfer via heat sink 140. With the above techniques, high performance GPUs 112 can be integrated into graphics subsystems with sufficient cooling to prevent overheating during operation. The performance of fans 120 and 130 is described in greater detail below in conjunction with FIG. 3.

Fan Performance Comparison

Figure 3:
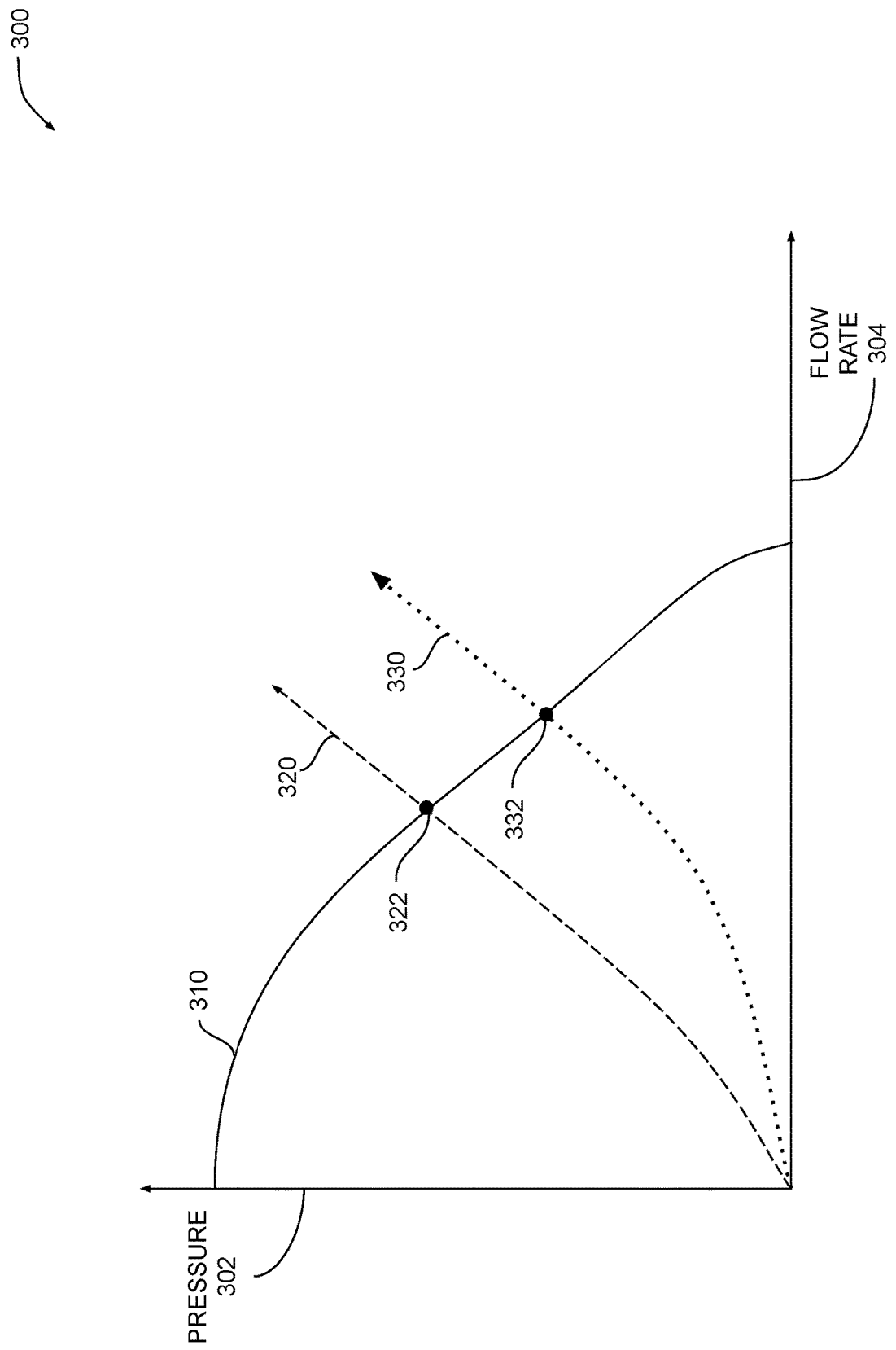
FIG. 3 is a graph of axial fan flow rate as a function of pressure, according to various embodiments.

FIG. 3 is a graph of axial fan airflow as a function of pressure, according to various embodiments. As shown, a graph 300 plots pressure 302 as a function of flow rate 304. Fan performance curve 310 represents the performance of an axial fan similar to fan 120 and/or fan 130. Fan performance curve 310 describes how the air pressure induced by the fan changes with different flow rates when the fan rotates at a constant rotational speed. The fan directs airflow at different flow rates depending on the presence of various physical obstacles that impede one or more airflow paths through the fan.

Impedance curves 320 and 330 correspond to separate regions of graphics subsystem 100 and describe how variations in flow rate within those regions cause changes in air pressure. In particular, impedance curve 320 corresponds to the region of graphics subsystem 100 where fan 120 resides and indicates that increasing flow rate causes an increase in air pressure. Impedance curve 330 corresponds to the region of graphics subsystem 100 where fan 130 resides and indicates that increasing flow rate similarly causes an increase in air pressure.

Comparing impedance curves 320 and 330 reveals that pressure proximate to fan 120 increases faster than pressure proximate to fan 130 as flow rate increases. Pressure increases faster proximate to fan 120 because PCB 110 presents a significant physical obstacle to airflow directed by fan 120 that forces the airflow to turn and either recirculate along airflow paths 202 or exit graphics subsystem along airflow path 204. Conversely, pressure increases slower proximate to fan 130 because heat sink 140 does not present a significant physical obstacle to airflow directed by fan 130 and instead allows airflow to proceed relatively unimpeded through heat sink 140 along airflow path 212.

Intersection point 322 between fan performance curve 310 and impedance curve 320 represents the operating point of fan 120 for a given fan speed, while intersection point 332 between fan performance curve 310 and impedance curve 330 represents the operating point of fan 130 for a given fan speed. As is shown, fan 130 can achieve a higher flow rate at a lower pressure compared to fan 120. Accordingly, fan 130 achieves more effective convective cooling and therefore more effectively transfers heat from heat sink 140 to the environment compared to fan 120 or other conventional fan designs. As noted above, fan 130 also increases how effectively fan 120 transfers heat from heat sink 140 by intaking a portion of heated air that recirculates along airflow paths 202.

Exemplary Implementations of a Graphics Subsystem

Figure 4:
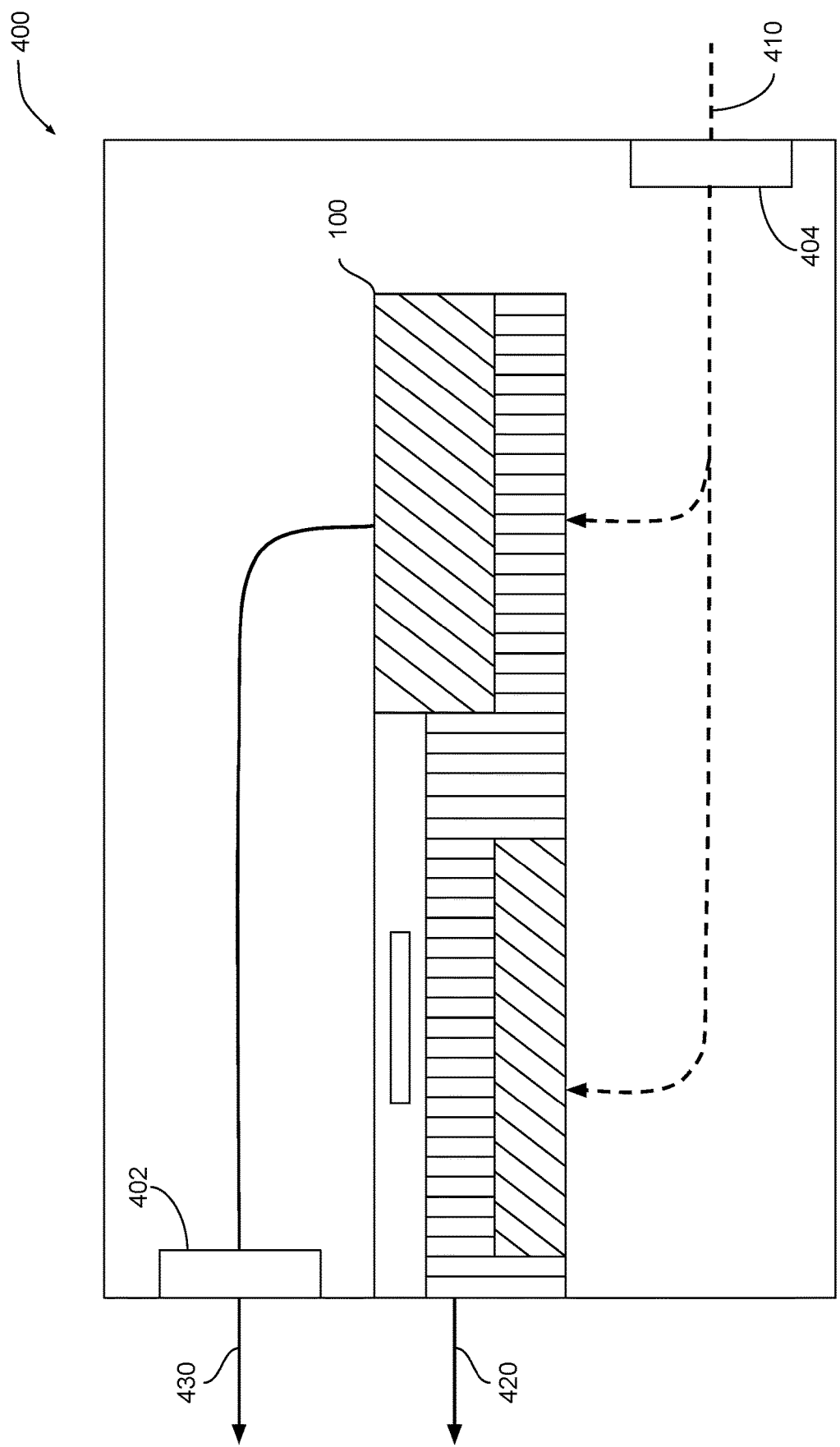
FIG. 4 illustrates a computer chassis that houses the graphics subsystem of FIG. 1, according to various embodiments.

FIG. 4 illustrates a computer chassis that houses the graphics subsystem of FIG. 1, according to various embodiments. As shown, computer chassis 400 includes graphics subsystem 100, an exhaust fan 402, and an intake fan 404. In operation, intake fan 404 directs air along airflow path 410 to graphics subsystem 100. Via fans 120 and 130, graphics subsystem 100 uses that air to cool PCB 110 and/or GPU 112 and then exhausts heated air along airflow paths 420 and 430. Exhaust fan 402 facilitates the removal of heated air from within computer chassis 400. Computer chassis 400 may also include a computing device that is coupled to graphics subsystem 100. An exemplary computing device is described below in conjunction with FIG. 5.

Figure 5:
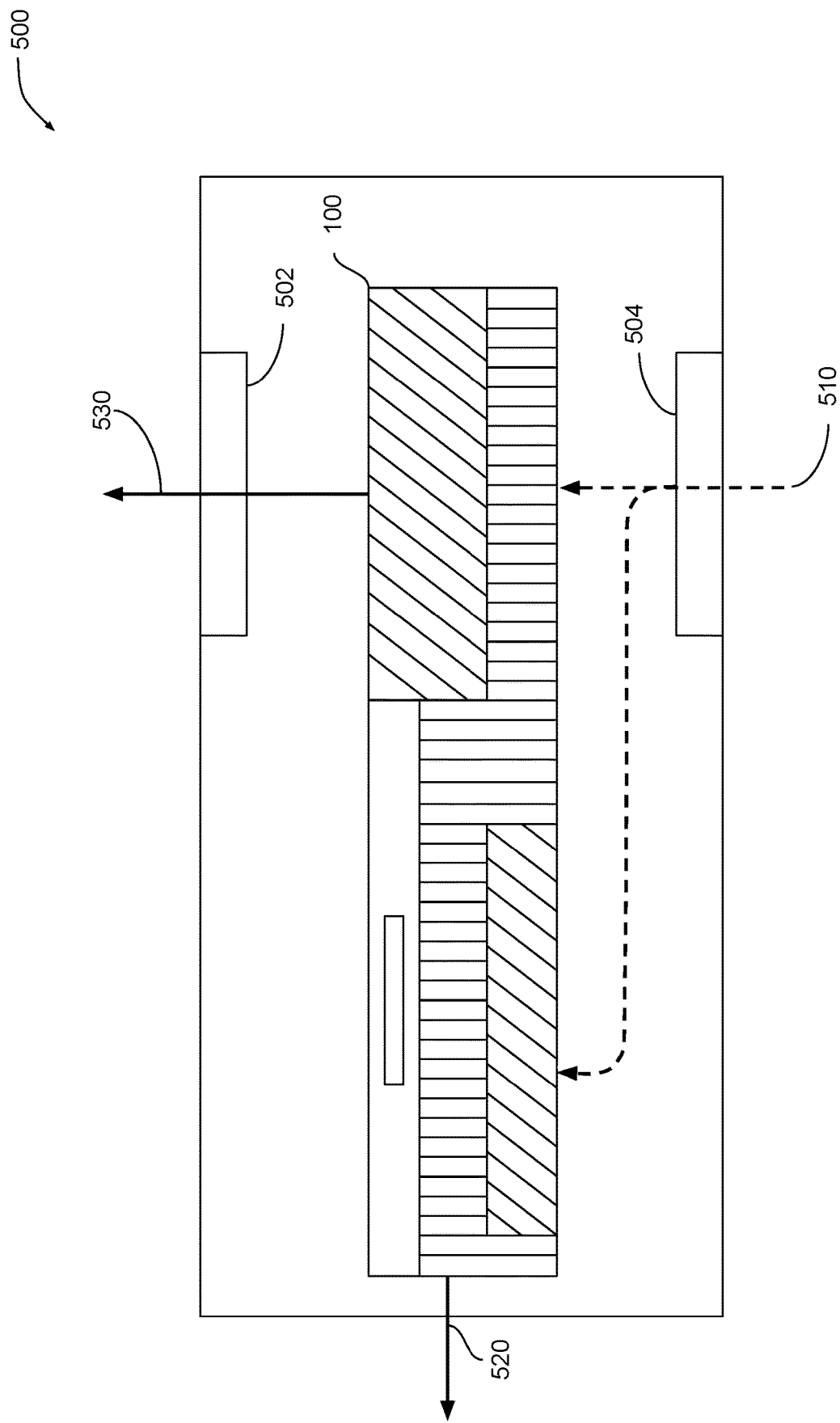
FIG. 5 illustrates an alternative computer chassis that houses the graphics subsystem of FIG. 1, according to various embodiments.

FIG. 5 illustrates an alternative computer chassis that houses the graphics subsystem of FIG. 1, according to various embodiments. As shown, computer chassis 500 includes graphics subsystem 100, an exhaust fan 502, and an intake fan 504. In operation, intake fan 504 directs air along airflow path 510 to graphics subsystem 100. Via fans 120 and 130, graphics subsystem 100 uses that air to cool PCB 110 and/or GPU 112 and then exhausts heated air along airflow paths 520 and 530. Exhaust fan 502 facilitates the removal of heated air from within computer chassis 500. In one embodiment, computer chassis 500 may be configured to house a miniaturized computer system. For example, computer chassis 500 could be a mini-ITX type chassis.

Referring generally to FIGS. 4-5, graphics subsystem 100 may be implemented within any technically feasible type of computer chassis. Further, graphics subsystem may be coupled to any technically feasible type of computing device. An exemplary computing device to which graphics subsystem can be coupled is described below in conjunction with FIG. 6.

Figure 6:
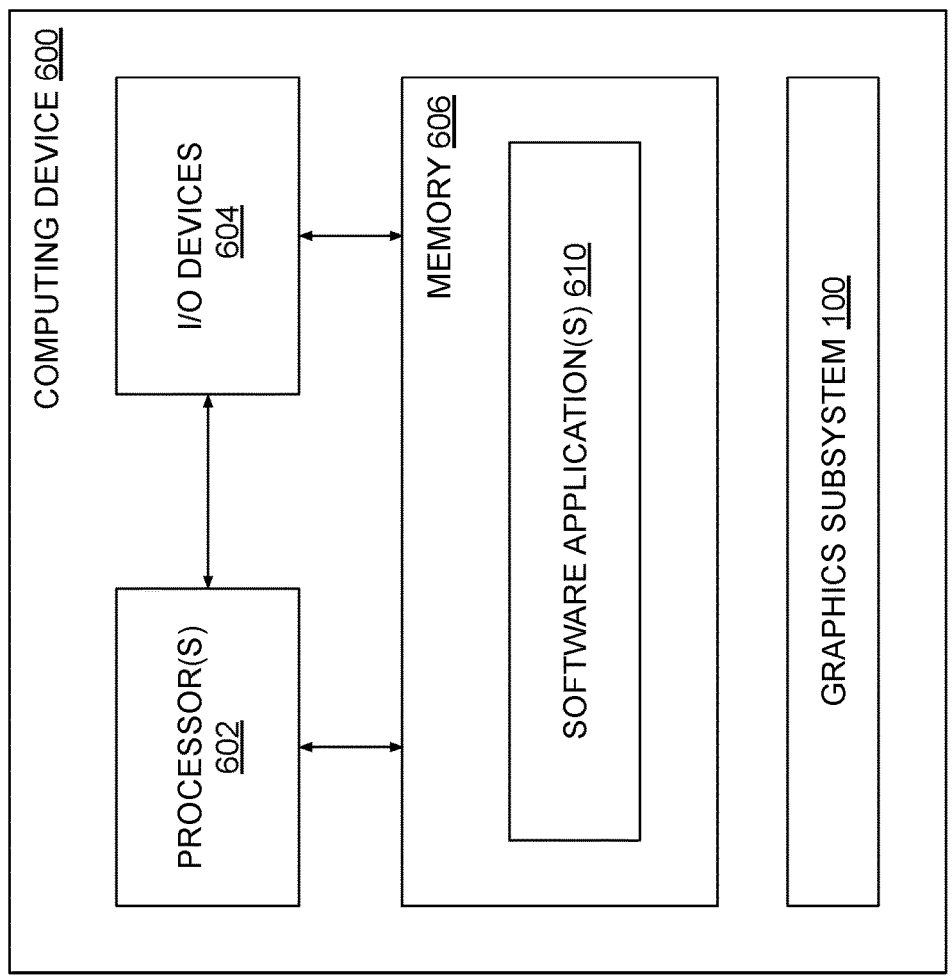
FIG. 6 illustrates an exemplary computing device that includes the graphics subsystem of FIG. 1, according to various embodiments.

FIG. 6 illustrates an exemplary computing device that includes the graphics subsystem of FIG. 1, according to various embodiments. As shown, computing device 600 includes one or more processors 602, input/output (I/O) devices 604, and a memory 606 that includes one or more software applications 610. Computing device 600 also includes graphics subsystem 100, which can be coupled to computing device 600 via a PCIe slot and interconnected with any of the other components of computing device 600 in any technically feasible manner. In various embodiments, graphics subsystem 100 may be coupled to computing device 600 via any technically feasible type of interface beyond those which comply with the PCIe standard. Processor 602 is configured to execute software application(s) 610 and to offload graphics processing operations associated with the software application(s) 610 to graphics subsystem 100 for processing via GPU 112. Graphics subsystem 100 returns processing results, such as rendered pixels, to computing device 600 for display via a display device that could reside, for example, within I/O devices 604. In various embodiments, computing device 600 may be implemented as a server computer (or virtualized instance thereof) and reside within a datacenter. As a general matter, graphics subsystem 100 can be implemented within any technically feasible type of computer system.

In sum, a graphics subsystem includes a PCB, a set of one or more fans, and a heat sink. A GPU is integrated into the PCB. The PCB is shortened to occupy a smaller portion of the width of the graphics subsystem compared to the PCB within a conventional graphics subsystem. The heat sink is coupled to the PCB and/or GPU and configured to extend beyond an edge of the PCB, thereby occupying a larger portion of the width of the graphics subsystem compared to the PCB. A first fan is disposed partially or fully beyond the edge of the PCB and is configured to direct air through the portion of the heat sink that extends beyond the edge of the PCB, along a first airflow path, and out of the graphics subsystem. A second fan is configured to direct air through the heat sink, along a second airflow path, towards the GPU. Because the first airflow path is not impeded by the PCB, air traversing the first airflow path has a low pressure and a high flow rate, thereby increasing the convective cooling capabilities of the heat sink. Further, at least some of the air traversing the second airflow path mixes with air traversing the first airflow path, thereby reducing the recirculation of warmer air induced by the second fan.

At least one technical advantage of the disclosed design relative to the prior art is that, with the disclosed design, graphics subsystems can be equipped with higher performance GPUs relative to the GPUs typically included in conventional graphics subsystems. Accordingly, the disclosed design enables higher performance GPUs to be implemented in computer systems without a substantial risk of overheating. These technical advantages represent one or more technological advancements over prior art approaches.

1. Some embodiments include a system, comprising a printed circuit board on which a processor resides, a first fan that is coupled to the printed circuit board such that a first airflow path for cooling the processor traverses through the first fan at a distance outside of a boundary of the printed circuit board, and a second fan that is coupled to the printed circuit board such that a second airflow path for cooling the processor traverses through the second fan within the boundary of the printed circuit board.

2. The system of clause 1, wherein a third airflow path extends from the second fan to the first fan and couples the second airflow path to the first airflow path.

3. The system of any of clauses 1-2, wherein the first airflow path has a lower air pressure and a higher flow rate than the second airflow path.

4. The system of any of clauses 1-3, wherein the first fan is disposed relative to the second fan such that an amount of air that recirculates through the second fan is reduced during operation of the first fan.

5. The system of any of clauses 1-4, wherein the first airflow path traverses through a heat sink that is thermally coupled to at least one of the printed circuit board or the processor before traversing through the first fan.

6. The system of any of clauses 1-5, wherein the first airflow path traverses through a heat sink that is thermally coupled to at least one of the printed circuit board or the processor after traversing through the first fan.

7. The system of any of clauses 1-6, wherein the first airflow path is substantially linear, and the second airflow path curves by at least ninety degrees.

8. Some embodiments include a system, comprising a printed circuit board on which a processor resides, and a first fan that is coupled to the printed circuit board such that a first airflow path for cooling the processor traverses through the first fan substantially perpendicular to the printed circuit board at a distance outside of a boundary of the printed circuit board.

9. The system of clause 8, wherein the boundary comprises an edge of the printed circuit board.

10. The system of any of clauses 8-9, wherein an axis of the first fan is disposed substantially perpendicular to the printed circuit board.

11. The system of any of clauses 8-10, wherein the system has a first width, and the printed circuit board has a second width that is less than the first width.

12. The system of any of clauses 8-11, further comprising a heat sink that is wider than the printed circuit board, wherein the first airflow path intersects the heat sink.

13. The system of any of clauses 8-12, further comprising a heat sink that has a first width, wherein the printed circuit board has a second width, the first fan has a third width, and the first width is equal to the sum of the second width and the third width.

14. The system of any of clauses 8-13, further comprising a heat sink that is thermally coupled to the printed circuit board, wherein the heat sink extends across the boundary of the printed circuit board and intersects the first airflow path and wherein the first fan is embedded within the heat sink.

15. Some embodiments include a computing device, comprising a printed circuit board on which a processor resides, a first fan that is coupled to the printed circuit board such that a first airflow path for cooling the processor traverses through the first fan at a distance outside of a boundary of the printed circuit board, and a second fan that is coupled to the printed circuit board such that a second airflow path for cooling the processor traverses through the second fan within the boundary of the printed circuit board.

16. The computing device of clause 15, wherein a third airflow path extends from the second fan to the first fan and couples the second airflow path to the first airflow path.

17. The computing device of any of clauses 15-16, wherein the first airflow path has a lower air pressure and a higher flow rate than the second airflow path.

18. The computing device of any of clauses 15-17, wherein the processor comprises a graphics processing unit or a central processing unit that generates heat when performing processing operations, and the first fan dissipates at least a portion of the heat via the first airflow path.

19. The computing device of any of clauses 15-18, wherein the first airflow path traverses through a heat sink that includes a plurality of heat fins.

20. The computing device of any of clauses 15-19, wherein the first airflow path traverses through a heat sink that includes zero or more heat pipes.

Any and all combinations of any of the claim elements recited in any of the claims and/or any elements described in this application, in any fashion, fall within the contemplated scope of the present embodiments and protection.

The descriptions of the various embodiments have been presented for purposes of illustration, but are not intended to be exhaustive or limited to the embodiments disclosed. Many modifications and variations will be apparent to those of ordinary skill in the art without departing from the scope and spirit of the described embodiments.

Aspects of the present embodiments may be embodied as a system, method or computer program product. Accordingly, aspects of the present disclosure may take the form of an entirely hardware embodiment, an entirely software embodiment (including firmware, resident software, microcode, etc.) or an embodiment combining software and hardware aspects that may all generally be referred to herein as a "module," a "system," or a "computer." Furthermore, aspects of the present disclosure may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

Aspects of the present disclosure are described above with reference to flowchart illustrations and/or block diagrams of methods, apparatus (systems) and computer program products according to embodiments of the disclosure. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine. The instructions, when executed via the processor of the computer or other programmable data processing apparatus, enable the implementation of the functions/acts specified in the flowchart and/or block diagram block or blocks. Such processors may be, without limitation, general purpose processors, special-purpose processors, application-specific processors, or field-programmable gate arrays.

The flowchart and block diagrams in the figures illustrate the architecture, functionality, and operation of possible implementations of systems, methods and computer program products according to various embodiments of the present disclosure. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

While the preceding is directed to embodiments of the present disclosure, other and further embodiments of the disclosure may be devised without departing from the basic scope thereof, and the scope thereof is determined by the claims that follow.

What is claimed is:

1. A system, comprising:
a printed circuit board on which a processor resides;
a first fan that is physically disposed on a subsystem that includes the printed circuit board such that a first airflow path for cooling the processor traverses through the first fan at a distance outside of a boundary of the printed circuit board; and
a second fan that is physically disposed on the subsystem that includes the printed circuit board such that a second airflow path for cooling the processor traverses through the second fan within the boundary of the printed circuit board.

2. The system of claim 1, wherein a third airflow path extends from the second fan to the first fan and couples the second airflow path to the first airflow path.

3. The system of claim 1, wherein the first airflow path has a lower air pressure and a higher flow rate than the second airflow path.

4. The system of claim 1, wherein the first fan is disposed relative to the second fan such that an amount of air that recirculates through the second fan is reduced during operation of the first fan.

5. The system of claim 1, wherein the first airflow path traverses through a heat sink that is thermally coupled to at least one of the printed circuit board or the processor before traversing through the first fan.

6. The system of claim 1, wherein the first airflow path traverses through a heat sink that is thermally coupled to at least one of the printed circuit board or the processor after traversing through the first fan.

7. The system of claim 1, wherein the first airflow path is substantially linear, and the second airflow path curves by at least ninety degrees.

8. The system of claim 1, wherein the boundary comprises a first edge of the circuit board, the first fan is disposed adjacent to the first edge, the first airflow path traverses through the first fan at the distance outside the first edge, the second fan is disposed across from the printed circuit board, and the second airflow path traverses through the second fan at a second distance inside the first edge.

9. A system, comprising:
a subsystem that includes a printed circuit board that has a first width and on which a processor resides;
a heat sink that has a second width; and
a first fan that is physically disposed adjacent to a first edge of the printed circuit board and has a third width, wherein a first airflow path for cooling the processor traverses through the first fan substantially perpendicular to the printed circuit board at a first distance outside the first edge of the printed circuit board, and the second width is equal to a sum of the first width and the third width.

10. The system of claim 9, wherein an axis of the first fan is disposed substantially perpendicular to the printed circuit board.

11. The system of claim 9, wherein the system has a fourth width, and the first width is less than the fourth width.

12. The system of claim 9, wherein the first airflow path intersects the heat sink.

13. The system of claim 9, wherein the heat sink is thermally coupled to the printed circuit board, wherein the heat sink extends beyond the first edge of the printed circuit board and intersects the first airflow path, and wherein the first fan is embedded within the heat sink.

14. A computing device, comprising:
a printed circuit board on which a processor resides;
a first fan that is physically disposed on a subsystem that includes the printed circuit board such that a first airflow path for cooling the processor traverses through the first fan at a distance outside of a boundary of the printed circuit board; and
a second fan that is physically disposed on the subsystem that includes the printed circuit board such that a second airflow path for cooling the processor traverses through the second fan within the boundary of the printed circuit board.

15. The computing device of claim 14, wherein a third airflow path extends from the second fan to the first fan and couples the second airflow path to the first airflow path.

16. The computing device of claim 14, wherein the first airflow path has a lower air pressure and a higher flow rate than the second airflow path.

17. The computing device of claim 14, wherein the processor comprises a graphics processing unit or a central processing unit that generates heat when performing processing operations, and the first fan dissipates at least a portion of the heat via the first airflow path.

18. The computing device of claim 14, wherein the first airflow path traverses through a heat sink that includes a plurality of heat fins.

19. The computing device of claim 14, wherein the first airflow path traverses through a heat sink that includes zero or more heat pipes.

20. The computing device of claim 14, wherein the boundary comprises a first edge of the circuit board, the first fan is disposed adjacent to the first edge, the first airflow path traverses through the first fan at the distance outside the first edge, the second fan is disposed across from the printed circuit board, and the second airflow path traverses through the second fan at a second distance inside the first edge.

* * * * *